(12) United States Patent
Fanelli

(10) Patent No.: US 9,105,689 B1
(45) Date of Patent: Aug. 11, 2015

(54) BONDED SEMICONDUCTOR STRUCTURE WITH SIGEC LAYER AS ETCH STOP

(71) Applicant: Silanna Semiconductor U.S.A., Inc., San Diego, CA (US)

(72) Inventor: Stephen A. Fanelli, San Marcos, CA (US)

(73) Assignee: Silanna Semiconductor U.S.A., Inc., San Diego, CA (US)

( * ) Notice: Subject to any disclaimer, the term of this patent is extended or adjusted under 35 U.S.C. 154(b) by 0 days.

(21) Appl. No.: 14/223,060

(22) Filed: Mar. 24, 2014

(51) Int. Cl.
| H01L 21/30 | (2006.01) |
| H01L 21/46 | (2006.01) |
| H01L 21/762 | (2006.01) |
| H01L 29/78 | (2006.01) |
| H01L 29/06 | (2006.01) |

(52) U.S. Cl.
CPC ...... H01L 21/76256 (2013.01); H01L 29/0649 (2013.01); H01L 29/7842 (2013.01)

(58) Field of Classification Search
CPC .......................... H01L 21/306; H01L 21/465
USPC .......... 438/455, 598, 599; 257/347, E21.122
See application file for complete search history.

(56) References Cited

U.S. PATENT DOCUMENTS

| 5,906,708 | A | 5/1999 | Robinson et al. |
| 6,323,108 | B1 | 11/2001 | Kub et al. |
| 6,815,278 | B1 | 11/2004 | Ieong et al. |
| 7,268,063 | B1 | 9/2007 | Quick et al. |
| 7,282,753 | B2 | 10/2007 | Kub et al. |
| 7,547,930 | B2 | 6/2009 | Chu |
| 7,977,145 | B2 | 7/2011 | Hannebauer |
| 8,466,036 | B2 | 6/2013 | Brindle et al. |
| 2005/0156246 | A1 | 7/2005 | Lochtefeld et al. |
| 2006/0172505 | A1* | 8/2006 | Koester et al. ................ 438/455 |
| 2006/0199353 | A1 | 9/2006 | Kub et al. |
| 2008/0213973 | A1* | 9/2008 | Dao ............................. 438/458 |
| 2011/0230030 | A1* | 9/2011 | de Souza et al. .............. 438/303 |
| 2012/0146193 | A1 | 6/2012 | Stuber et al. |
| 2013/0280884 | A1 | 10/2013 | Brindle et al. |
| 2014/0030871 | A1* | 1/2014 | Arriagada et al. ............ 438/459 |

FOREIGN PATENT DOCUMENTS

WO     2013019250     2/2013

OTHER PUBLICATIONS

International Search Report and Written Opinion dated Jun. 18, 2015 for PCT Patent Application No. PCT/US2015/21243.

* cited by examiner

*Primary Examiner* — Phuc Dang
(74) *Attorney, Agent, or Firm* — The Mueller Law Office, P.C.

(57) ABSTRACT

A semiconductor structure is formed with a first wafer (e.g. a handle wafer) and a second wafer (e.g. a bulk silicon wafer) bonded together. The second wafer includes an active layer, which in some embodiments is formed before the two wafers are bonded together. A substrate is removed from the second wafer on an opposite side of the active layer from the first wafer using a SiGeC layer as an etch stop. In some embodiments, the SiGeC layer is then removed; but in some other embodiments, it remains as a strain-inducing layer.

20 Claims, 3 Drawing Sheets

BONDED SEMICONDUCTOR STRUCTURE WITH SIGEC LAYER AS ETCH STOP

BACKGROUND OF THE INVENTION

Layer transfer, or wafer bonding, techniques may be used to form the layers of a semiconductor-on-insulator (SOI) wafer having a bulk substrate layer, a buried oxide (BOX) layer, and a semiconductor layer. Integrated circuits (ICs) with active devices and conductive interconnects can then be formed into and onto the semiconductor layer.

An alternative layer transfer process may start with an SOI wafer (having an active device layer already formed), invert the SOI wafer, bond the SOI wafer to a handle wafer, and then remove the bulk substrate and the BOX. In this manner, the active device layer is transferred to the handle wafer. Additionally, the handle wafer may have previously undergone other processing, so that the resulting bonded semiconductor structure may have desirable features that are difficult to achieve in a single wafer subjected to all of the necessary processing steps. For example, the handle wafer may have a substrate with a trap rich layer, so that the resulting semiconductor structure has the trap rich layer between the active device layer and the substrate. However, if a single wafer had been used, and the trap rich layer had been formed in the wafer before the active device layer, then the processing techniques used to form the active device layer could have degraded the trap rich layer. In this example, therefore, the layer transfer process involving separately processed wafers enables a better final product.

In some respects, or for some applications, the development of SOI technology represented an advance over traditional bulk semiconductor processes. However, SOI wafers are generally more complex and expensive than simple bulk semiconductor wafers. Part of the added expense is due to additional processing steps required to produce the SOI wafers before active device fabrication can begin.

SUMMARY OF THE INVENTION

In some embodiments, a semiconductor structure is formed with a first wafer (e.g. a handle wafer) and a second wafer (e.g. a bulk silicon wafer) bonded together. The second wafer includes a substrate, a SiGeC (silicon-germanium-carbon) layer, and an active layer. The substrate is removed from the second wafer on an opposite side of the active layer from the first wafer using the SiGeC layer as an etch stop.

In some embodiments, the SiGeC layer is then removed; but in some other embodiments, it remains as a strain-inducing layer. In some embodiments, the active layer and the SiGeC layer are formed before the two wafers are bonded together. In some embodiments, the active layer includes a gate and a channel, and after the bonding of the second wafer to the first wafer the gate is between the channel and the first wafer. In some embodiments, the first wafer includes a trap rich layer.

DETAILED DESCRIPTION OF THE INVENTION

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

Figure 1:
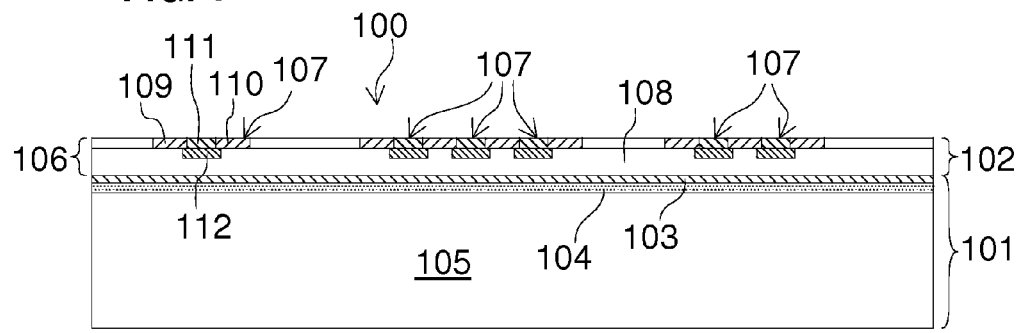
FIG. 1 is a simplified cross section diagram of a semiconductor structure in accordance with an embodiment of the present invention.

A semiconductor structure 100 is shown in FIG. 1 in accordance with an embodiment of the present invention. The semiconductor structure 100 may be incorporated into an overall IC chip (not shown). The semiconductor structure 100 generally includes a first wafer 101 and a remaining portion of a second wafer 102 that have been bonded together. In some embodiments, the first wafer 101 is a handle wafer that provides structural strength for the semiconductor structure 100. In some embodiments, the second wafer 102 is a bulk semiconductor wafer, rather than a semiconductor-on-insulator (SOI) wafer. Since the second wafer 102 may be a bulk semiconductor wafer, the initial cost of the second wafer 102, prior to CMOS processing, is generally less than that of an SOI wafer. Additionally, since the standard substrate and buried oxide (BOX) of an SOI wafer would have to be removed to form a structure comparable to the remaining portion of the second wafer 102, it is unnecessary to start with an SOI wafer to form the semiconductor structure 100. Therefore, an advantage of the present invention is that a cheaper bulk semiconductor wafer may be used for the second wafer 102. Additional advantages will become apparent in the following description.

The first wafer 101 generally includes a bonding layer 103, a trap rich layer 104, and a substrate layer 105. Additional components may also be incorporated into the first wafer 101, but are not shown for simplicity.

The remaining portion of the second wafer 102 generally includes at least an active layer 106. The active layer 106 generally includes active devices 107 and an insulator layer 108 therein. The active devices 107 generally include a source 109, a drain 110, a channel 111, and a gate 112. In some embodiments, the active layer 106 also includes a bonding layer. Alternatively, the insulator layer 108 (or at least a thin portion thereof at the outward surface) may serve as the bonding layer. Additional components may also be incorporated into the active layer 106, but are not shown for simplicity.

The trap rich layer 104 in the first wafer 101 effectively combats parasitic surface conduction because the trap rich layer 104 significantly degrades the carrier lifetimes of charge carriers in the trap rich layer 104. Since the carriers cannot travel far, therefore, the effective resistance of the substrate layer 105 is preserved and the capacitance as seen by the active layer 106 is not as dependent upon the signals in the active layer 106. The process described below for forming the semiconductor structure 100 generally preserves the efficacy of the trap rich layer 104 and minimizes disruption of the integrity of the overall IC chip of which the semiconductor structure 100 is a part.

Figure 2:
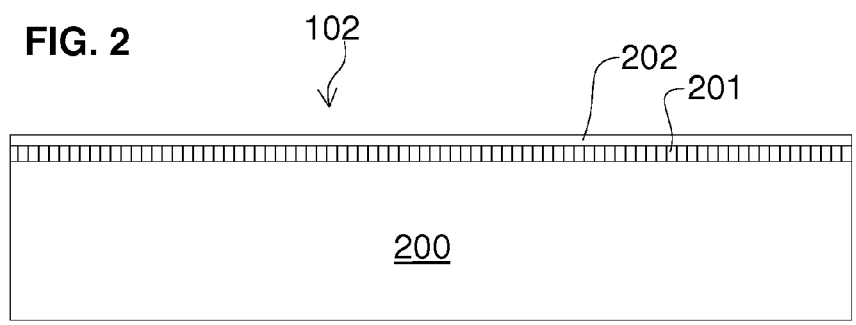
FIGS. 2 and 3 are simplified cross section diagrams at different stages of fabrication of a first wafer that may be used to form the semiconductor structure shown in FIG. 1 in accordance with an embodiment of the present invention.

A process in accordance with an embodiment of the present invention for forming the semiconductor structure 100 is described herein with reference to FIGS. 2-7. The second wafer 102 generally starts with a bulk semiconductor (e.g. silicon, etc.) substrate 200, as shown in FIG. 2. A silicon-germanium-carbon (SiGeC) layer 201 and a semiconductor layer 202 are formed into or onto the bulk semiconductor substrate 200. The SiGeC layer 201 may be epitaxially grown on the bulk semiconductor substrate 200 or ion implanted into the bulk semiconductor substrate 200 or formed by any other appropriate process. The semiconductor layer 202 may be epitaxially grown on the SiGeC layer 201. If the SiGeC layer 201 is formed by ion implantation, and the implantation is deep enough, then the semiconductor layer 202 may be (or be formed from) a portion of the bulk semiconductor substrate 200 above the implanted SiGeC layer 201.

Figure 3:
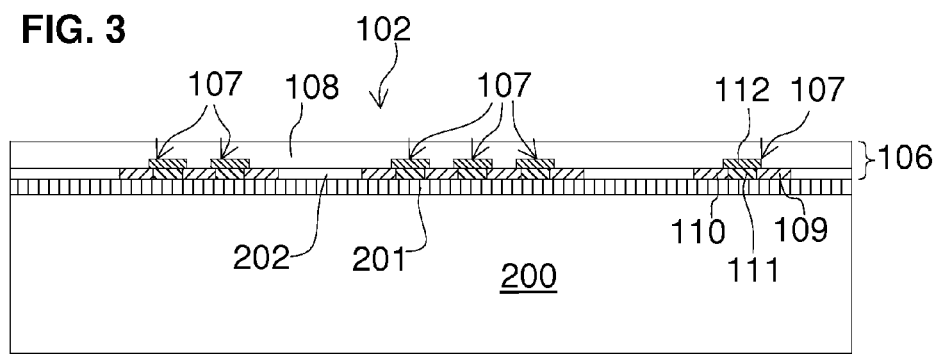

The active devices 107 and the insulator layer 108 are formed by CMOS processing into and onto the semiconductor layer 202 as shown in FIG. 3. In this manner, the active layer 106 is formed above the SiGeC layer 201 with the channel 111 between the gate 112 and the SiGeC layer 201. Additionally, in some embodiments, the surface of the insulator layer 108 is polished, or a bonding layer (not shown) is formed onto the insulator layer 108, in anticipation of later fusion bonding with the first wafer 101.

Figure 4:
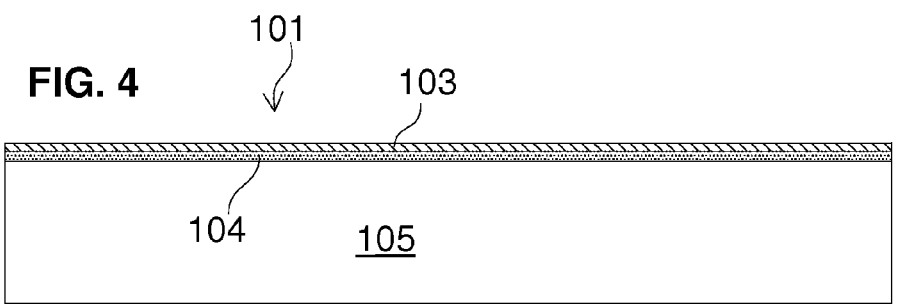
FIG. 4 is a simplified cross section diagram of a second wafer that may be used to form the semiconductor structure shown in FIG. 1 in accordance with an embodiment of the present invention.

In a separate process, e.g. concurrently with any portion of the process generally shown in FIGS. 2 and 3 for forming the second wafer 102, the first wafer 101 is formed as shown in FIG. 4. The trap rich layer 104 and the bonding layer 103 may be formed in any appropriate manner, e.g. by any appropriate one or more of the processes described in U.S. Pat. No. 8,466,036, which is incorporated herein by reference as if fully set forth herein.

Figure 5:
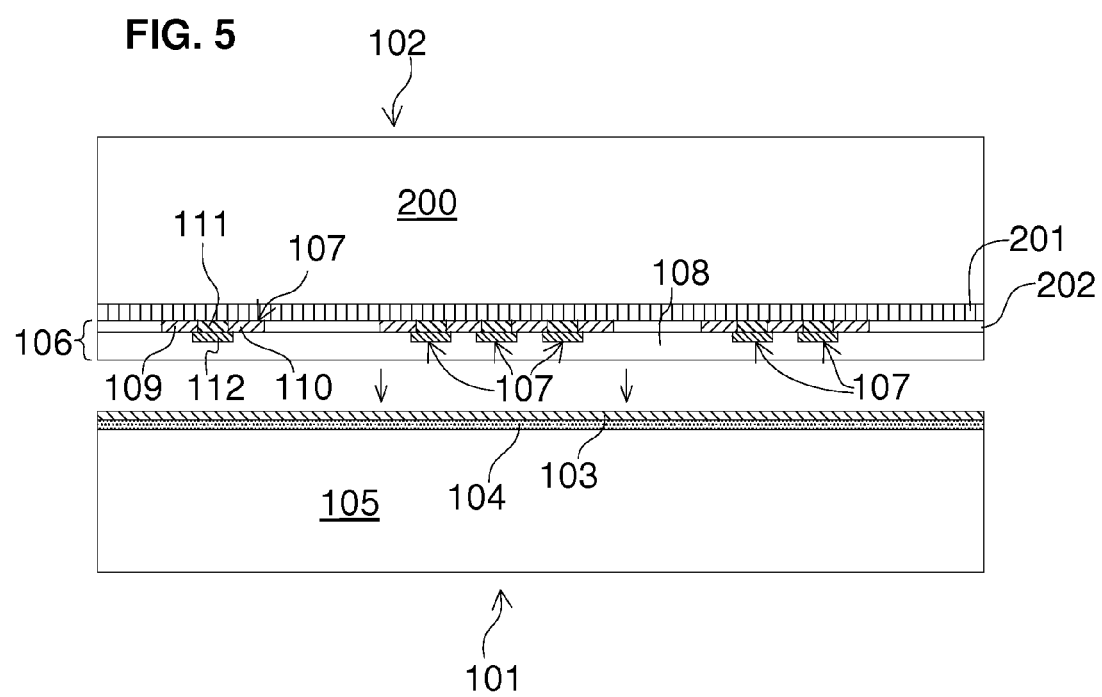
FIGS. 5, 6, and 7 are simplified cross section diagrams at different stages of fabrication of the semiconductor structure shown in FIG. 1 in accordance with an embodiment of the present invention.

The second wafer 102 is inverted, as shown in FIG. 5, and bonded to the first wafer 101. Thus, the two wafers 101 and 102 are bonded face-to-face, i.e. with the insulator layer 108 at the front or top surface of the second wafer 102 bonded to the bonding layer 103 at the front or top surface of the first wafer 101. The gate 112 is thus between the channel 111 and the first wafer 101.

Figure 6:
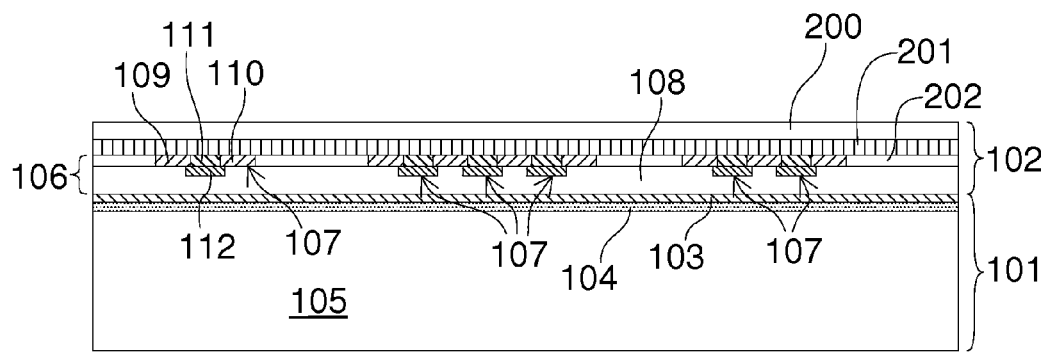
Figure 7:
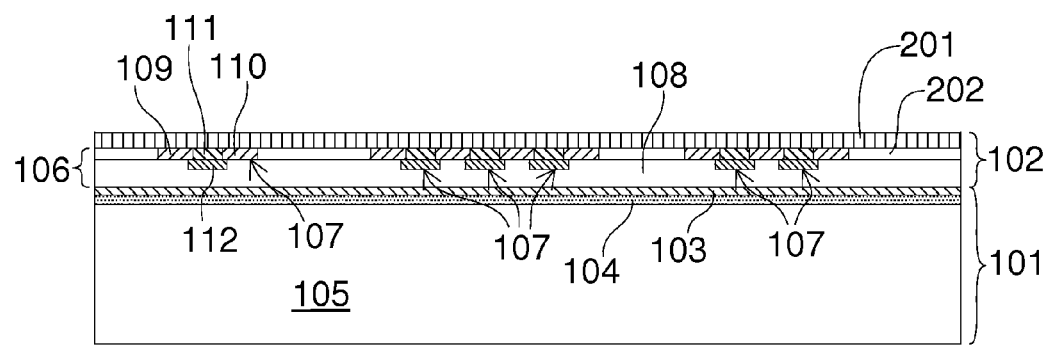

The bulk semiconductor substrate 200 is generally removed from the second wafer 102. This removal may be done in a two-step process. First, most of the bulk semiconductor substrate 200 is removed by grinding, as shown in FIG. 6. Then the remaining semiconductor material is removed, e.g. with a wet etch that is selective to the SiGeC layer 201, as shown in FIG. 7. The SiGeC layer 201, thus, serves as an etch stop layer. When the SiGeC layer 201 is reached, the etch rate may decrease, allowing a complete or uniform removal of all the semiconductor material of the bulk semiconductor substrate 200.

The SiGeC layer 201 may then be removed, e.g. by another wet etch, to form the semiconductor structure 100, as shown in FIG. 1. Alternatively, the SiGeC layer 201 may remain as a strain inducing layer that induces strain in the channel 111. As a strain layer, the SiGeC layer 201 would provide the advantage of increasing the mobility in the channel 111 and improving the performance of the overall IC. The benefits of the strain inducing layer would not be achieved with some other types of etch stop layers, e.g. a P+ etch stop layer.

The semiconductor structure 100 and the process that forms it generally enables the active layer 106 to be formed as a relatively thin layer. This process is contrasted with a process that uses an SOI wafer instead of the second wafer 102. In such a situation, the BOX of the SOI wafer may be used as an etch stop layer to remove the underlying substrate. The resulting structure would also potentially have a relatively thin active layer. However, the present invention does so with a less expensive bulk semiconductor wafer. Additionally, the process described above is contrasted with a process that uses a different type of etch stop, such as a P+ etch stop layer. In such a situation, the dopant in the P+ etch stop layer would be much less tolerant of the high temperatures used in CMOS processing. Thus, the P+ dopant could potentially diffuse within the semiconductor wafer during subsequent CMOS processing, thereby adding dopant to, and seriously changing the characteristics of, the source 109, the drain 110, and the channel 111. To avoid this problem with a P+ etch stop layer, the P+ etch stop layer would have to be formed much deeper into the bulk semiconductor substrate 200 or the semiconductor layer 202 would have to be much thicker. Either way, the active layer 106 could not be formed to be as thin as it can with the present invention.

In some embodiments, the active layer 106 could be made relatively thin with a polish stop process. This process may use a selective CMP to stop on STI (shallow trench isolation) regions patterned on the second wafer 102.

Another advantage of the present invention is related to the layer transfer process. A common application for etch stop layers is to layer transfer to create an SOI wafer before CMOS processing. However, if the SiGeC etch stop layer is used to create an SOI wafer prior to CMOS processing, then the transferred film would have to be polished (e.g. CMP, etc.) smooth for subsequent processing. This process would be challenging and would likely result in a non-uniform active device layer with the CMP process. In some embodiments of the present invention, on the other hand, the SiGeC layer 201 is first processed in the second wafer 102 and then layer transferred to a handle wafer (e.g. the first wafer 101). In other words, CMOS processing is done with the epi or implanted SiGeC layer 201 and then layer transferred to a handle wafer toward the end of the process, i.e. after the active devices 107 are fabricated. The rough surface that is likely to exist on the second wafer 102 at the stage of FIG. 3 does not need to be polished, because no other active devices will be fabricated on this surface.

Although embodiments of the invention have been discussed primarily with respect to specific embodiments thereof, other variations are possible. Various configurations of the described structure or process may be used in place of, or in addition to, the configurations presented herein. For example, additional layers of passivation and insulation may be disposed in-between described layers where appropriate.

Those skilled in the art will appreciate that the foregoing description is by way of example only, and is not intended to limit the invention. Nothing in the disclosure should indicate that the invention is limited to systems that are implemented on a single wafer. Nothing in the disclosure should indicate that the invention is limited to systems that require a particular form of semiconductor processing or integrated circuits. Nothing in the disclosure should limit the invention to semiconductor devices based on silicon. In general, any diagrams presented are only intended to indicate one possible configuration, and many variations are possible. Those skilled in the art will also appreciate that methods and systems consistent with the present invention are suitable for use in a wide range of applications encompassing semiconductor structures.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. A method comprising:
forming a first wafer having a first bonding material;
forming a second wafer having a substrate, a SiGeC layer, an active layer and a second bonding material, the active layer being between the SiGeC layer and the second bonding material;
bonding the second wafer to the first wafer at the first and second bonding materials; and
removing the substrate using the SiGeC layer as an etch stop.

2. The method of claim 1, wherein:
the SiGeC layer induces a strain in at least a portion of the active layer.

3. The method of claim 1, further comprising:
removing the SiGeC layer.

4. The method of claim 1, wherein:
the forming of the second wafer includes forming the SiGeC layer and the active layer prior to the bonding of the second wafer to the first wafer.

5. The method of claim 1, wherein:
the second wafer is a bulk silicon wafer.

6. The method of claim 1, wherein:
the active layer includes a gate and a channel; and
the bonding of the second wafer to the first wafer causes the gate to be between the channel and the first wafer.

7. The method of claim 1, wherein:
the forming of the first wafer includes forming a trap rich layer therein.

8. A semiconductor structure comprising:
a first wafer;
a first bonding material at a surface of the first wafer;
a second wafer bonded to the first wafer;
an active layer within the second wafer; and
a second bonding material at a surface of the second wafer and being bonded to the first bonding material;
wherein a substrate has been removed from the second wafer on an opposite side of the active layer from the first wafer using a SiGeC layer as an etch stop.

9. The semiconductor structure of claim 8, further comprising:
the SiGeC layer as also a strain-inducing layer.

10. The semiconductor structure of claim 8, wherein:
the SiGeC layer has been removed.

11. The semiconductor structure of claim 8, wherein:
the SiGeC layer and the active layer are formed within the second wafer prior to bonding the first wafer to the second wafer.

12. The semiconductor structure of claim 8, wherein:
the second wafer is a bulk silicon wafer prior to formation of the active layer and the SiGeC layer therein.

13. The semiconductor structure of claim 8, wherein:
the active layer includes a gate and a channel, the gate being between the channel and the first wafer.

14. The semiconductor structure of claim 8, further comprising:
a trap rich layer within the first wafer.

15. A semiconductor structure comprising:
a handle wafer;
a first bonding material within the handle wafer;
a bulk silicon wafer bonded to the handle wafer;
an active layer within the bulk silicon wafer;
a second bonding material within the bulk silicon wafer and being bonded to the first bonding material; and
a SiGeC layer within the bulk silicon wafer on an opposite side of the active layer from the handle wafer;
wherein a substrate has been removed from the bulk silicon wafer using the SiGeC layer as an etch stop; and
wherein the handle wafer provides structural strength for the semiconductor structure.

16. The semiconductor structure of claim 15, further comprising:
the SiGeC layer as also a strain-inducing layer.

17. The semiconductor structure of claim 15, wherein:
the SiGeC layer has been removed.

18. The semiconductor structure of claim 15, wherein:
the SiGeC layer and the active layer are formed within the bulk silicon wafer prior to bonding the handle wafer to the bulk silicon wafer.

19. The semiconductor structure of claim 15, wherein:
the active layer includes a gate and a channel, the gate being between the channel and the handle wafer.

20. The semiconductor structure of claim 15, further comprising:
a trap rich layer within the handle wafer.

* * * * *